United States Patent
Ohtsuki et al.

(10) Patent No.: US 8,043,871 B2
(45) Date of Patent: Oct. 25, 2011

(54) METHOD FOR FORMING OXIDE FILM ON SILICON WAFER

(75) Inventors: Tsuyoshi Ohtsuki, Annaka (JP); Satoshi Tobe, Annaka (JP); Yasushi Mizusawa, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 12/921,492

(22) PCT Filed: Mar. 24, 2009

(86) PCT No.: PCT/JP2009/001281
§ 371 (c)(1),
(2), (4) Date: Sep. 8, 2010

(87) PCT Pub. No.: WO2009/130847
PCT Pub. Date: Oct. 29, 2009

(65) Prior Publication Data
US 2011/0033958 A1    Feb. 10, 2011

(30) Foreign Application Priority Data

Apr. 25, 2008  (JP) .................................. 2008-115672

(51) Int. Cl.
*H01L 21/66* (2006.01)
(52) U.S. Cl. ............................................... 438/16
(58) Field of Classification Search .................. 438/16; 356/237.5
See application file for complete search history.

(56) References Cited

U.S. PATENT DOCUMENTS

| 6,020,247 A | 2/2000 | Wilk et al. |
| 2007/0145535 A1* | 6/2007 | Ohmi et al. ................. 257/618 |
| 2008/0187768 A1* | 8/2008 | Kouvetakis et al. .......... 428/450 |

FOREIGN PATENT DOCUMENTS

| EP | 0 592 671 A1 | 4/1994 |
| JP | A-05-013395 | 1/1993 |
| JP | A-10-079376 | 3/1998 |

OTHER PUBLICATIONS

Deal, "Thermal Oxidation Kinetics of Silicon in Pyrogenic $H_2O$ and 5% $HCl/H_2O$ Mixtures," *Journal of the Electrochemical Society: Solid-State Science Technology*, vol. 125, No. 4, pp. 576-579, 1978.

(Continued)

*Primary Examiner* — Ha Tran T Nguyen
*Assistant Examiner* — Shaun Campbell
(74) *Attorney, Agent, or Firm* — Oliff & Berridge, PLC

(57) ABSTRACT

The present invention provides a method for forming an oxide film on a silicon wafer, comprising: measuring surface roughness of the silicon wafer and/or crystallinity in a surface layer portion of the silicon wafer in advance; adjusting oxidizing conditions for the silicon wafer based on the measurement value; and forming the oxide film on the silicon wafer under the adjusted oxidizing conditions. As a result, there can be provided the method for forming an oxide film by which the oxidizing conditions can be adjusted based on a state of the surface and/or the surface layer of the silicon wafer before forming the oxide film and even an ultrathin oxide film can be thereby accurately formed.

19 Claims, 4 Drawing Sheets

OTHER PUBLICATIONS

Irene et al., "Silicon Oxidation Studies: Silicon Orientation Effects on Thermal Oxidation," *Journal of the Electrochemical Society: Solid-State Science and Technology*, vol. 133, No. 6, pp. 1253-1256, 1986.

Raider et al., "Reversal of Relative Oxidation Rates of <111> and <100> Oriented Silicon Substrates at Low Oxygen Partial Pressures," *Journal of the Electrochemical Society: Solid-State Science and Technology*, vol. 127, No. 8, pp. 1783-1787, 1980.

Deal et al., "Thermal Oxidation of Heavily Doped Silicon," *Journal of the Electrochemical Society*, vol. 112, No. 4, pp. 430-435, 1965.

Ho et al., "Thermal Oxidation of Heavily Phosphorus-Doped Silicon," *Journal of the Electrochemical Society: Solid-State Science and Technology*, vol. 125, No. 4, pp. 665-671, 1978.

Choi et al., "Anomalous oxidation rate of silicon implanted with very high doses of arsenic," Appl. Phys. Lett., vol. 51, No. 13, pp. 1001-1003, 1987.

Ho et al., "Si/SiO$_2$ Interface Oxidation Kinetics: A Physical Model for the Influence of High Substrate Doping Levels, I, Theory," *Journal of the Electrochemical Society: Solid-State Science and Technology*, vol. 126, No. 9, pp. 1516-1522, 1979.

Ho et al., "Si/SiO$_2$ Interface Oxidation Kinetics: A Physical Model for the Influence of High Substrate Doping Levels, II. Comparison with Experiment and Discussion," *Journal of the Electrochemical Society: Solid-State Science and Technology*, vol. 126, No. 9, pp. 1523-1530, 1979.

Takakuwa, "Growth Kinetics of Very Thin Oxide Layers on Si(001) Surface Monitored in Real-time by Auger Electron Spectroscopy Combined with Reflection High Energy Electron Diffraction," Surface Science, vol. 23, No. 9, pp. 536-552, 2002 (with abstract).

International Search Report issued in International Application No. PCT/JP2009/001281 dated Jun. 16, 2009.

International Preliminary Report on Patentability issued in International Patent Application No. PCT/JP2009/001281 dated Dec. 13, 2010.

* cited by examiner

[Fig. 1]
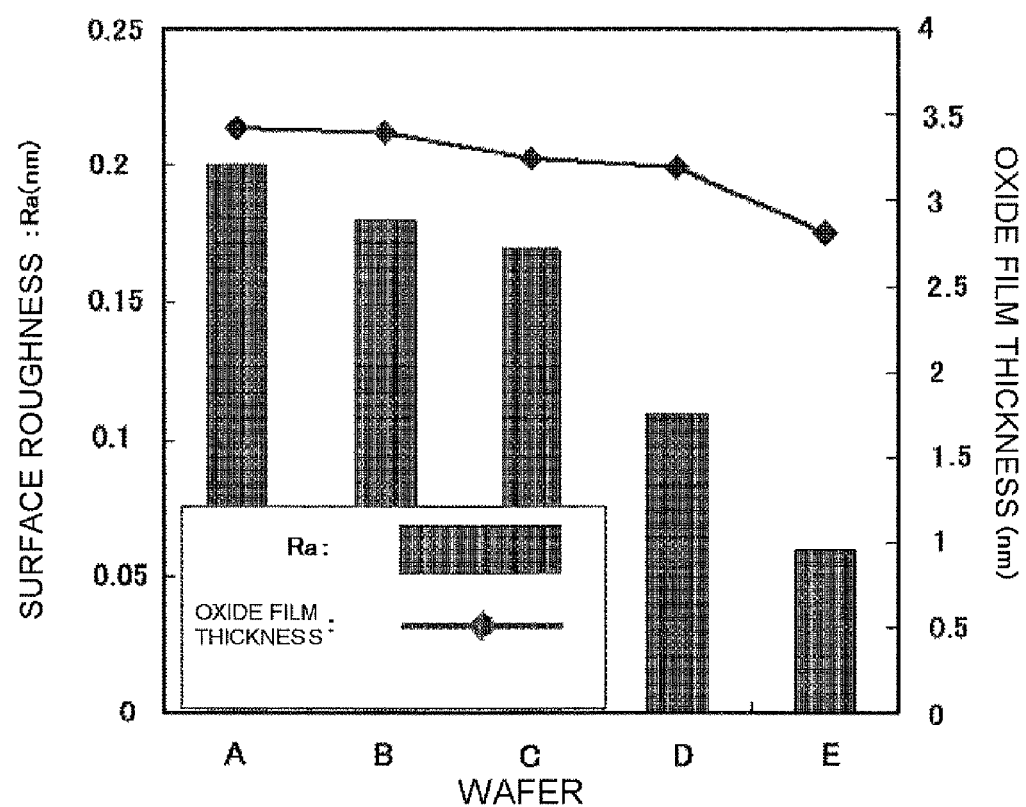

[Fig. 2]
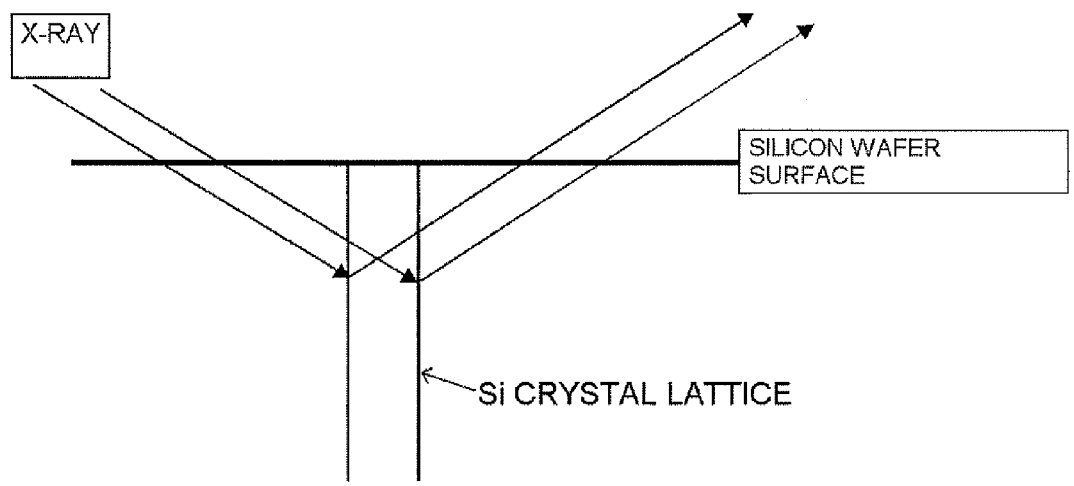

[Fig. 3]
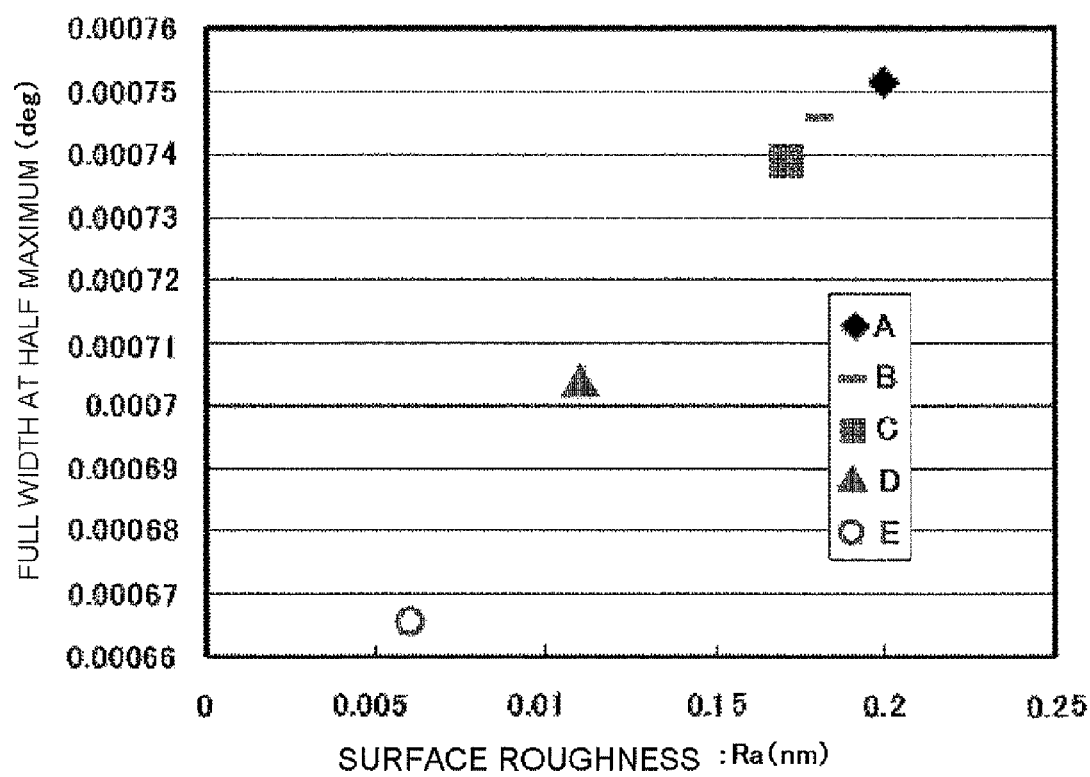

[Fig. 4]
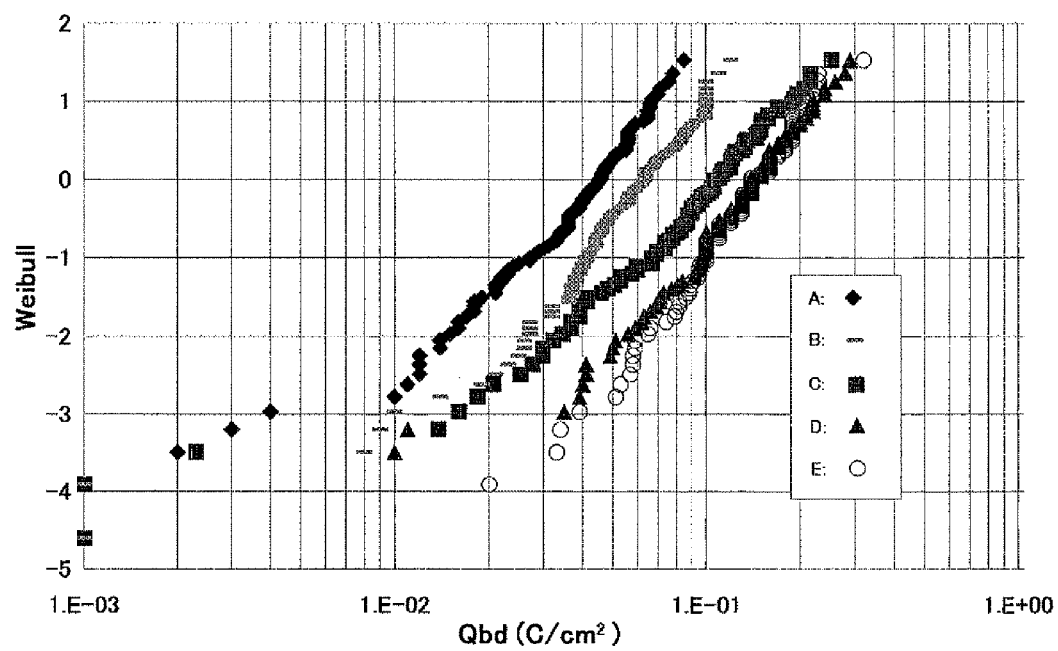

METHOD FOR FORMING OXIDE FILM ON SILICON WAFER

TECHNICAL FIELD

The present invention relates to a method for forming, e.g., a thin oxide film on a silicon wafer.

BACKGROUND ART

Semiconductor devices such as an MOS (Metal Oxide Semiconductor) capacitor or a transistor are formed on a main surface of a semiconductor silicon wafer. A thickness of an insulator film such as a gate oxide film formed in such semiconductor devices is reduced with realization of high densities of the semiconductor devices and, on the other hand, decreasing a power supply voltage is difficult, whereby the insulator film is used with a high electric field intensity. Therefore, an insulator film having a higher quality is required.

As a reduction in film thickness of silicon oxide films involved by miniaturization advances, an unevenness allowable range for an oxide film thickness closes on a value corresponding to several atoms as an absolute value. Further, since insulation properties are degraded due to a direct tunnel current and gate leak increases in time of applying an electric field to an oxide film with a reduction in film thickness, new High-k materials have been studied with respect to a limit as the insulator film. However, in case that such new materials are used, a silicon oxide film is grown thinly and a High-k material is grown thereon. Therefore, accurately forming a thin oxide film is becoming more important.

An oxidation technique and others have been examined as control over growth of such an oxide film. Although a crystal orientation (B. E. Deal, J. Electrochem. Soc., 125, 576 (1978)., and E. A. Irene et. al., J. Electrochem. Soc., 133, 1253 (1986)., and S. I. Raider et. al., J. Electrochem. Soc., 127, 1783 (1980).) and a dopant (B. E. Deal et. al., 3. Electrochem. Soc., 112, 430 (1965)., and C. P. Ho et. al., J. Electrochem. Soc., 125, 665 (1978)., and Seong S. Choi et. al., Appl. Phys. Lett., 51, 1001 (1987)., and C. P. Ho et. al., J. Electrochem. Soc., 126, 1516, 1523 (1979).) and others are well known as influences of a silicon wafer itself, parameters other than those described above have been rarely reported in the era of a so-called ultrathin oxide film having a thickness of nearly 5 nm or below.

In regard to crystal orientation dependence, an oxidation rate has a relationship of <111>><100> irrespective of wet oxidation or dry oxidation. This plane orientation dependence of oxidation rate has been explained with a silicon atom density difference between crystal planes of respective plane orientations. A surface density is $7.85 \times 10^{14}(/cm^2)$ in <111> while a surface density is $6.8 \times 10^{14}(/cm^2)$ in <100>, and the oxidation rate rises as the surface density increases.

However, there is complexity between <110> plane and <111> plane. The surface density is $7.85 \times 10^{14}(/cm^2)$ in <111> while a surface density is $9.6 \times 10^{14}(/cm^2)$ in <110>, and an oxidation rate relationship can be assumed to be <110>><111> in terms of the surface density argument. This order is provided when an oxide film is as thin as approximately 15 nm, but the order is reversed and <111>><110> is achieved when the film thickness increases. Such a complicated behavior has been still argued.

Further, although a dopant acts in a direction along which the oxidation rate is accelerated, in more detail, if the dopant is phosphorus, a degree of an increase in oxidation rate rises as a temperature is reduced, and a rate increasing effect is decreased as the temperature is increased. Arsenic has the same tendency. On the other hand, in case of boron, the rate increasing effect is maintained even though the temperature is high.

Furthermore, according to recent studies (e.g, "Growth Kinetics of Very Thin Silicon Oxide Layers Monitored in Real-time by RHEED-AES" by Takakuwa, Surface Science, 23, 536 (2002).), models in which both vacancies that are point defects produced due to an interface damage and emitted Si atoms play the role of promoting an oxidizing reaction have been proposed. These models attempt an explanation of an oxidation mechanism in a thin-film region in particular which cannot be explained with a conventional Deal-Grove model as detailed analysis of the oxidizing reaction advances.

However, the above-described conventional parameters alone are insufficient to provide a uniform film thickness when forming, e.g., an ultrathin oxide film, and new parameters for accurately adjusting oxidizing conditions are required.

DISCLOSURE OF INVENTION

Therefore, in view of the above-described problems, it is an object of the present invention to provide a method for forming an oxide film by which oxidizing conditions can be adjusted based on a state of a surface and/or a surface layer of a silicon wafer before forming an oxide film and, e.g., an ultrathin oxide film can be thereby accurately formed.

To achieve this object, according to the present invention, there is provided a method for forming an oxide film on a silicon wafer, comprising: measuring surface roughness of the silicon wafer and/or crystallinity in a surface layer portion of the silicon wafer in advance; adjusting oxidizing conditions for the silicon wafer based on the measurement value; and forming the oxide film on the silicon wafer under the adjusted oxidizing conditions.

As described above, according to the method for forming an oxide film of the present invention, since the oxidizing conditions can be adjusted based on the surface roughness and/or the crystallinity of the silicon wafer, the measurement can be performed by the simple method and the oxidizing conditions can be accurately adjusted. Furthermore, according to the method of the present invention, since the oxidizing conditions can be adjusted based on the surface roughness or the crystallinity, even if wafers have the same material or the same crystal orientation which has been utilized as a conventional parameter, oxidation rates of the respective wafers can be grasped, each oxide film can be accurately formed, and even a thin oxide film can be formed with a uniform film thickness on each wafer. Moreover, as different from a conventional oxidation rate parameter, the surface roughness or the crystallinity can be adjusted by e.g., repolishing after the measurement and before the formation of the oxide film, whereby the oxidation rate for the wafer can be adjusted and the oxide film having a good quality can be formed.

Additionally, since the crystallinity and the surface roughness have a close relationship, the oxidizing conditions for the silicon wafer can be accurately adjusted by measuring both of them or checking one of them.

Further, an oxidation rate of a wafer having excellent surface roughness or crystallinity becomes uniform within a wafer plane, and an oxide film having a thickness that is uniform within the wafer plane can be readily formed, whereby a wafer having excellent surface roughness or crystallinity can be sorted to form an oxide film.

At this time, it is preferable that the surface roughness of the silicon wafer is measured by using an AFM to measure an Ra value of the surface roughness of the silicon wafer.

As described above, according to the present invention, to measure the surface roughness, the Ra value of the surface roughness of the silicon wafer can be measured by the generally adopted AFM.

At this time, it is preferable to adjust the oxidizing conditions for the silicon wafer based on whether the measured Ra value of the surface roughness is not more than 0.17 nm.

As described above, when the Ra value of the surface roughness measured by the AFM is not more than 0.17 nm, the oxidation rate is sufficiently small, a film thickness of the oxide film can be readily controlled, the oxide film that is uniform within the wafer plane can be readily formed, and hence the oxidizing conditions can be further easily adjusted by, e.g., sorting each wafer on which the oxide film is to be formed together based on the above-described value.

Furthermore, it is preferable that the crystallinity in the surface layer portion of the silicon wafer is measured by measuring a full width at half maximum of a rocking curve obtained by X-ray diffraction measurement.

When the crystallinity is measured by measuring a full width at half maximum of the rocking curve obtained by the X-ray diffraction measurement as described above, a numerical value accurately indicating the crystallinity can be grasped, thus further readily adjusting the oxidizing conditions.

At this time, it is preferable to adjust the oxidizing conditions for the silicon wafer based on whether the measured full width at half maximum of the rocking curve is not more than 0.00074°.

When the full width at half maximum of the rocking curve obtained by the X-ray diffraction measurement is not more than 0.00074° as described above, a film thickness of the oxide film can be easily controlled since the oxidation rate is sufficiently low, the oxide film that is uniform within the wafer plane can be easily formed, and hence the oxidizing conditions can be further readily adjusted by, e.g., sorting wafers that are put into the same batch based on the above-described value.

At this time, it is preferable to set a thickness of the oxide film to be formed to 5 nm or below.

Even in the case of an ultrathin oxide film of 5 nm or below, according to the method for forming an oxide film of the present invention, the oxidation rate for each silicon wafer can be accurately grasped and thereby the oxide film that has a good film thickness accuracy and is uniform within the wafer plane can be formed.

As described above, according to the method for forming an oxide film on a silicon wafer of the present invention, since the oxidizing conditions can be adjusted based on the surface roughness or the crystallinity before forming the oxide film on the silicon wafer, as different from the conventional oxidation rate parameter using a dope amount or a crystal orientation, oxidation rate of wafers having the same material or the same crystal orientation can be grasped, and the oxide film having a desired thickness can be accurately formed by the simple method. Moreover, since wafers having good surface roughness or crystallinity have oxidation rates, which are substantially the same within the planes thereof, such wafers can be selected to form the excellent oxide film having a thickness that is uniform within the wafer plane. Therefore, in the present invention, if the measurement is performed and a result is poor surface roughness or poor crystallinity, e.g., repolishing is performed and thereby the oxide film having a film thickness that is uniform within the wafer plane can be efficiently formed based on the simple method. In particular, according to the present invention, even an ultrathin oxide film of 5 nm or below can be formed by accurately controlling its thickness.

BRIEF DESCRIPTION OF DRAWINGS

FIG. 1 is a graph showing a relationship between surface roughness and an oxide film thickness of a silicon wafer;

FIG. 2 is a view showing an outline of X-ray diffraction measurement;

FIG. 3 is a graph showing a relationship between a full width at half maximum of a rocking curve and surface roughness; and FIG. 4 is a graph showing Weibull plot of a TDDB evaluation result.

BEST MODE(S) FOR CARRYING OUT THE INVENTION

For example, when forming an ultrathin oxide film, there is a problem that unevenness in film thickness is observed in the formed oxide film due to a difference in oxidation rate between respective wafers even though the wafers have the same specifications.

In regard to this point, to first examine a relationship between surface roughness and an oxidation rate, the present inventors formed an oxide film on each of wafers having different surface roughness values under the same conditions. Consequently, as shown in FIG. 1 representing a relationship between an oxide film thickness and surface roughness, they discovered that the oxidation rate and the surface roughness have a correlation since a formed oxide film is thin (a lower oxidation rate) in a wafer having a smaller surface roughness value.

Then, surface roughness of a silicon wafer and crystallinity in a surface layer portion of the silicon wafer were examined. The surface roughness was examined by measuring an Ra value by an AFM, and the crystallinity was examined by performing X-ray diffraction measurement with respect to a portion of the wafer near the outermost surface in an In-Plane arrangement to obtain a full width at half maximum of a rocking curve. A Cu ray was used as the X-ray.

Consequently, as shown in FIG. 3 depicting a relationship between the surface roughness and the full width at half maximum, it can be understood that both of them have a good correlation. This result reveals a fact that, as findings of an oxidation mechanism, especially a behavior on an initial stage of oxidation, a wafer having large surface roughness has a high oxidation rate, but this tendency has a close relationship with silicon surface crystallinity. That is, it was considered that, when the crystallinity is disordered (the surface roughness is increased), silicon-silicon bonding is apt to be cleaved and oxygen atoms can readily enter this cleavage whereby the oxidation rate increases.

As a result of the above-described review, the present inventors discovered that, when the surface roughness of a silicon wafer and/or the crystallinity in a surface layer portion of the silicon wafer is measured and oxidizing conditions are adjusted based on a measurement value to form the oxide film, the oxide film having a uniform and accurate thickness can be formed even tough it is an ultrathin oxide film, thereby bringing the present invention to completion.

Although an embodiment of a method for forming an oxide film on a silicon wafer according to the present invention will now be described in detail hereinafter, the present invention is not restricted thereto.

In the method for forming an oxide film according to the present invention, surface roughness of a silicon wafer and/or crystallinity in a surface layer portion of the silicon wafer is first measured.

Both or one of the surface roughness and the crystallinity may be measured. Both of them have a close correlation, an oxidation rate can be sufficiently grasped by just measuring one of them, and both of them may be measured for a further accuracy.

At this time, it is preferable to measure the surface roughness of the silicon wafer by measuring an Ra value of the surface roughness by using an AFM (Atomic Force Microscope). As described above, the Ra value that is generally utilized to represent the surface roughness can be readily obtained by using the AFM.

Further, it is preferable to measure the crystallinity in the surface layer portion of the silicon wafer by measuring a full width at half maximum of a rocking curve obtained by X-ray diffraction measurement.

When a full width at half maximum of a rocking curve obtained by the X-ray diffraction measurement is used as described above, the crystallinity of the wafer surface layer portion can be accurately grasped as a numerical value.

Although a method of this X-ray diffraction measurement is not restricted in particular, for example, a Cu ray may be used as the X-ray, and the measurement can be performed in an In-Plane arrangement. FIG. 2 shows an outline of the X-ray diffraction measurement in this case. An X-ray reflecting position in FIG. 2 changes when an Si crystal lattice expands or contracts due to a damage.

Then, in the present invention, oxidizing conditions for the silicon wafer are adjusted based on a measurement value obtained from the measurement as described above.

Since an oxidation rate of the silicon wafer is low when the surface roughness is small (the crystallinity is good), the oxidizing conditions can be readily adjusted based on the measurement value obtained from the measurement as described above. At this time, the oxidizing conditions to be adjusted are not restricted in particular, and an oxidation time, an oxidation temperature and others can be adjusted. Additionally, the oxidizing conditions can be adjusted by e.g., oxidizing wafers having substantially the same surface roughness (the crystallinity) in the same batch to form an oxide film having a uniform thickness on each of wafers in the batch.

Further, for example, when wafers having the same surface roughness/crystallinity are utilized as film thickness monitors, dissociation of film thicknesses from actual wafers can be dissipated, thereby suppressing unevenness in oxide film between batches.

At this time, when the Ra value of the surface roughness is measured by using the AFM, it is preferable to adjust the oxidizing conditions for the silicon wafer based on whether the Ra value is not more than 0.17 nm.

When the Ra value is not more than 0.17 nm as described above, since the oxidation rate is sufficiently small as shown in FIG. 1, a film thickness of the oxide film can be readily controlled, and the oxide film that is uniform within a wafer plane can be easily formed, whereby the oxidizing conditions can be further readily adjusted by, e.g., sorting wafers that are put into the same batch based on the above-described value.

Furthermore, when a full width at half maximum of the rocking curve is measured based on the X-ray diffraction measurement, it is preferable to adjust the oxidizing conditions for the silicon wafer based on whether this full width at half maximum is not more than 0.00074°.

When the full width at half maximum of the silicon wafer surface layer portion is not more than 0.00074° as described above, the Ra value of the surface roughness of this surface is approximately 0.17 nm or below as shown in FIG. 3, the oxidation rate is thus sufficiently low, a film thickness of the oxide film can be easily controlled, and the oxide film that is uniform within the wafer plane can be readily formed, whereby the oxidizing conditions can be further easily adjusted by, e.g., sorting wafers that are put into the same batch based on the above-described value.

Additionally, for example, an ultrathin oxide film may be formed on each wafer having the measurement value or a lower value alone, each wafer having the measurement value or a larger value may be subjected to, e.g., repolishing so that each wafer has the measurement value or a smaller value, and the oxide film can be formed thereon.

Then, in the present invention, the oxide film is formed on each silicon wafer under the thus adjusted oxidizing conditions.

At this time, a method for forming the oxide film is not restricted in particular, and a wafer can be subjected to, e.g., dry oxidation in a vertical heat treating furnace, thereby forming the oxide film under the adjusted oxidizing conditions.

At this time, it is preferable to form the oxide film having a thickness of 5 nm or below.

As described above, since the oxidation rate can be accurately grasped by using the method for forming an oxide film according to the present invention, an oxide film having an accurate thickness can be formed with high precision when forming an ultrathin oxide film of 5 nm or below, and an oxide film thickness within a wafer plane can have excellent uniformity. Therefore, it is possible to sufficiently cope with a recent cutting-edge device using an ultrathin oxide film.

As described above, according to the present invention, since the oxidizing conditions can be adjusted by measuring the surface roughness and/or the crystallinity, the oxidizing conditions can be accurately adjusted by the simple method, thereby accurately controlling a thickness of the oxide film.

The present invention will now be more specifically explained hereinafter based on an example, but the present invention is not restricted thereto.

EXAMPLE

Samples are first fabricated. P-type boron-doped semiconductor silicon wafers each having a diameter of 200 mm were prepared as samples.

The thus prepared semiconductor silicon wafers were subjected to polishing and others to provide wafers on 5 standards (A, B, C, D and E) having different surface roughness values obtained by measurement using an AFM. These semiconductor silicon wafers were placed on a boat to be put into a vertical heat treating furnace, a film thickness of 3 nm was determined as a target, and a heat treatment was performed at 800° C., in a dry oxygen atmosphere (an oxygen partial pressure of 0.1 atom: diluted oxidation) to form an oxide film on each wafer main surface. Then, an ellipsometer ($\lambda$=633 nm) was utilized to measure an oxide film thickness on each wafer (A, B, C, D or E). FIG. 1 shows a relationship between this oxide film thickness and the surface roughness.

As apparent from FIG. 1, it can be understood that a thickness of the oxide film is small (an oxidation rate is low) as the surface roughness is small (as the surface is flat). Therefore, it can be also understood that using such a measurement result enables adjusting oxidizing conditions.

A surface layer portion of each of these semiconductor silicon wafers (A, B, C, D and E) before a heat treatment was subjected to In-plane diffraction (see FIG. 2) as X-ray diffraction measurement to obtain a rocking curve, and its full width at half maximum was measured. FIG. 3 shows a relationship between the full width at half maximum and the surface roughness at this time.

As apparent from FIG. 3, it can be understood that the surface roughness and crystallinity have a close correlation, and both of them can be measured to be used as oxidation rate parameters.

Then, these semiconductor wafers (A, B, C, D and E) were placed on the boat and put into the vertical heat treating furnace, each oxide film was further formed by dry oxidation at 800° C. until reaching a thickness of 5 nm, thereby forming each gate oxide film.

Subsequently, these semiconductor wafers (A, B, C, D and E) were put into a CVD furnace, and a polysilicon layer was grown on each gate oxide film while doping phosphorus. A thickness of the grown polysilicon layer was approximately 300 nm, and a resistance value was approximately 25 Ω/sq in terms of sheet resistance.

Then, these semiconductor silicon wafers (A, B, C, D and E) were subjected to patterning using a photolithography technology and polysilicon layer removal based on etching, and 100 MOS capacitors using the polysilicon layer as an electrode were fabricated within each semiconductor silicon wafer plane. It is to be noted that, as polysilicon etching after photolithography, wet etching using a hydrofluoric-nitric acid was performed. At last, to remove the silicon oxide film formed on each semiconductor silicon wafer back surface, a resist was applied to each semiconductor silicon wafer main surface, and wet etching using a diluted hydrofluoric acid was carried out to remove the silicon oxide film on the wafer back surface.

An electric field stress was applied to the gate oxide film by using a constant-current TDDB method for applying a constant current to each processed semiconductor wafer (A, B, C, D or E) until the gate oxide film is destroyed. The applied current stress was 0.001 A/cm$^2$, and a measurement temperature was set to 100° C. while considering a reduction in measurement time. A tester connected to a fully-automatic prober was used for the measurement. An electrode area in this example was 4 mm$^2$. FIG. 4 shows a measurement result as a Weibull plot.

FIG. 4 is called the Weibull plot and it is often used when describing a semiconductor device failure distribution such as TDDB. Its abscissa represents a charge amount Qbd (C/cm$^2$) applied to the oxide film as an index while its ordinate represents $\ln\ln(1/(1-F(t)))$. Here, F(t) represents a cumulative failure rate and, for example, a Weibull value when the cumulative failure rate is 50% is −0.37.

As can be seen from FIG. 4, degradation in TDDB characteristics (a reduction in reliability) was observed in the wafers A and B each having Ra equal to or above 0.18 nm and a full width at half maximum higher than 0.00074°. As a result, it can be understood that a degree of degradation in TDDB characteristics is small in a silicon wafer having Ra of 0.17 nm or below and a full width at half maximum of 0.00074° or below. That is considered to be because an oxidation rate is sufficiently low and control over an oxide film thickness is easy in such a silicon wafer, an accurate film thickness can be thus obtained, and the oxidation rate is relatively uniform within a wafer plane, whereby film thickness uniformity of the oxide film is high.

It is to be noted that the present invention is not restricted to the foregoing embodiment. The embodiment is just an exemplification, and any examples that have substantially the same configuration and demonstrate the same functions and effects as the technical concept described in claims of the present invention are included in the technical scope of the present invention.

The invention claimed is:

1. A method for forming an oxide film on a silicon wafer, comprising: measuring surface roughness of the silicon wafer and/or crystallinity in a surface layer portion of the silicon wafer to obtain at least one measurement value; after the measuring, adjusting oxidizing conditions for the silicon wafer based on the at least one measurement value; and forming the oxide film on the silicon wafer under the adjusted oxidizing conditions.

2. The method for forming an oxide film on a silicon wafer according to claim 1, wherein the surface roughness of the silicon wafer is measured by using an AFM to measure an Ra value of the surface roughness of the silicon wafer.

3. The method for forming an oxide film on a silicon wafer according to claim 2, wherein the oxidizing conditions for the silicon wafer are adjusted based on whether the measured Ra value of the surface roughness is not more than 0.17 nm.

4. The method for forming an oxide film on a silicon wafer according to claim 1, wherein the crystallinity in the surface layer portion of the silicon wafer is measured by measuring a full width at half maximum of a rocking curve obtained by X-ray diffraction measurement.

5. The method for forming an oxide film on a silicon wafer according to claim 2, wherein the crystallinity in the surface layer portion of the silicon wafer is measured by measuring a full width at half maximum of a rocking curve obtained by X-ray diffraction measurement.

6. The method for forming an oxide film on a silicon wafer according to claim 3, wherein the crystallinity in the surface layer portion of the silicon wafer is measured by measuring a full width at half maximum of a rocking curve obtained by X-ray diffraction measurement.

7. The method for forming an oxide film on a silicon wafer according to claim 4, wherein the oxidizing conditions for the silicon wafer are adjusted based on whether the measured full width at half maximum of the rocking curve is not more than 0.00074°.

8. The method for forming an oxide film on a silicon wafer according to claim 5, wherein the oxidizing conditions for the silicon wafer are adjusted based on whether the measured full width at half maximum of the rocking curve is not more than 0.00074°.

9. The method for forming an oxide film on a silicon wafer according to claim 6, wherein the oxidizing conditions for the silicon wafer are adjusted based on whether the measured full width at half maximum of the rocking curve is not more than 0.00074°.

10. The method for forming an oxide film on a silicon wafer according to claim 1, wherein a thickness of the oxide film to be formed is set to 5 nm or below.

11. The method for forming an oxide film on a silicon wafer according to claim 2, wherein a thickness of the oxide film to be formed is set to 5 nm or below.

12. The method for forming an oxide film on a silicon wafer according to claim 3, wherein a thickness of the oxide film to be formed is set to 5 nm or below.

13. The method for forming an oxide film on a silicon wafer according to claim 4, wherein a thickness of the oxide film to be formed is set to 5 nm or below.

14. The method for forming an oxide film on a silicon wafer according to claim 5, wherein a thickness of the oxide film to be formed is set to 5 nm or below.

15. The method for forming an oxide film on a silicon wafer according to claim 6, wherein a thickness of the oxide film to be formed is set to 5 nm or below.

16. The method for forming an oxide film on a silicon wafer according to claim 7, wherein a thickness of the oxide film to be formed is set to 5 nm or below.

17. The method for forming an oxide film on a silicon wafer according to claim 8, wherein a thickness of the oxide film to be formed is set to 5 nm or below.

18. The method for forming an oxide film on a silicon wafer according to claim 9, wherein a thickness of the oxide film to be formed is set to 5 nm or below.

19. The method for forming an oxide film on a silicon wafer according to claim 1, wherein the oxidizing conditions for the silicon wafer are adjusted by at least one of:

an oxidation time, an oxidation temperature and sorting each silicon wafer on which the oxide film is to be formed together.

* * * * *